(12) United States Patent
Madras et al.

(10) Patent No.: US 10,636,960 B2
(45) Date of Patent: Apr. 28, 2020

(54) STRAINED PERPENDICULAR MAGNETIC TUNNEL JUNCTION DEVICES

(71) Applicant: Intel Corporation, Santa Clara, CA (US)

(72) Inventors: Prashanth P. Madras, Portland, OR (US); MD Tofizur Rahman, Portland, OR (US); Christopher J. Wiegand, Portland, OR (US); Brian Maertz, Portland, OR (US); Oleg Golonzka, Beaverton, OR (US); Kevin P. O'Brien, Portland, OR (US); Mark L. Doczy, Portland, OR (US); Brian S. Doyle, Portland, OR (US); Tahir Ghani, Portland, OR (US); Kaan Oguz, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/755,488

(22) PCT Filed: Sep. 25, 2015

(86) PCT No.: PCT/US2015/052376
§ 371 (c)(1),
(2) Date: Feb. 26, 2018

(87) PCT Pub. No.: WO2017/052627
PCT Pub. Date: Mar. 30, 2017

(65) Prior Publication Data
US 2018/0287050 A1    Oct. 4, 2018

(51) Int. Cl.
*H01L 43/08*    (2006.01)
*H01L 43/02*    (2006.01)
(Continued)

(52) U.S. Cl.
CPC ............ *H01L 43/02* (2013.01); *G11C 11/161* (2013.01); *H01F 10/3254* (2013.01);
(Continued)

(58) Field of Classification Search
CPC ..... H01L 43/08; H01L 27/222; H01L 27/228; H01F 10/3286; G11C 11/161
See application file for complete search history.

(56) References Cited

U.S. PATENT DOCUMENTS 7,449,345 B2    11/2008 Horng et al.
9,007,818 B2    4/2015  Sandhu et al.
(Continued)

FOREIGN PATENT DOCUMENTS

KR    1020060008166    1/2006
TW    200715283    4/2007
TW    201349605    12/2013

OTHER PUBLICATIONS

International Search Report and Written Opinion for International Patent Application No. PCT/US2015/052376, dated Jun. 23, 2016.
(Continued)

*Primary Examiner* — Mark V Prenty
(74) *Attorney, Agent, or Firm* — Green, Howard & Mughal LLP

(57) ABSTRACT

MTJ material stacks with a laterally strained free magnetic layer, STTM devices employing such stacks, and computing platforms employing such STTM devices. In some embodiments, perpendicular pMTJ material stacks included free magnetic layers that are compressively strained laterally by a surrounding material, which increases coercive field strength for a more stable device. In some embodiments, a pMTJ material stack is encased in a compressive-stressed material. In some further embodiments, a pMTJ material stack is encased first in a dielectric shell, permitting a
(Continued)

conductive material to be deposited over the shell as the compressive-stressed, strain-inducing material layer.

20 Claims, 9 Drawing Sheets

(51) Int. Cl.
    *H01L 43/12*     (2006.01)
    *G11C 11/16*     (2006.01)
    *H01F 10/32*     (2006.01)
    *H01L 27/22*     (2006.01)
    *H01L 43/10*     (2006.01)

(52) U.S. Cl.
    CPC ....... *H01F 10/3286* (2013.01); *H01L 27/228* (2013.01); *H01L 43/08* (2013.01); *H01L 43/10* (2013.01); *H01L 43/12* (2013.01)

(56) References Cited

U.S. PATENT DOCUMENTS

| | | | |
|---|---|---|---|
| 9,564,403 B2* | 2/2017 | Allinger | ................ H01L 23/552 |
| 10,128,432 B2* | 11/2018 | Shoji | ...................... B82Y 25/00 |
| 2011/0089511 A1 | 4/2011 | Keshtbod et al. | |
| 2012/0052258 A1 | 3/2012 | Op De Beeck et al. | |
| 2013/0001652 A1 | 1/2013 | Yoshikawa et al. | |
| 2014/0084398 A1 | 3/2014 | Oguz et al. | |

OTHER PUBLICATIONS

International Preliminary Report on Patentability from PCT/US2015/052376 notified Apr. 5, 2018, 11 pgs.

Office Action from Taiwan Patent Application No. 105126108 dated Dec. 27, 2019, 7 pgs.

\* cited by examiner

STRAINED PERPENDICULAR MAGNETIC TUNNEL JUNCTION DEVICES

CLAIM OF PRIORITY

This Application is a National Stage Entry of, and claims priority to, PCT Application No. PCT/US2015/052376, filed on Sep. 25, 2015 and titled "STRAINED PERPENDICULAR MAGNETIC TUNNEL JUNCTION DEVICES", which is incorporated by reference in its entirety for all purposes.

BACKGROUND

Magnetic tunnel junction (MTJ) devices, typically comprising a fixed magnetic layer and a free magnetic layer separated by a tunneling barrier layer, utilize a phenomenon known as tunneling magnetoresistance (TMR). For a structure including two ferromagnetic layers separated by a thin insulating tunnel layer, it is more likely that electrons will tunnel through the tunnel material layer when magnetizations of the two magnetic layers are in a parallel orientation than if they are not (non-parallel or antiparallel orientation). As such, the pMTJ can be switched between two states of electrical resistance, one state having a low resistance and one state with a high resistance. The greater the differential in resistance, the higher the TMR ratio: $(R_{AP}-R_p/R_p*100\%$ where $R_p$ and $R_{AP}$ are resistances for parallel and antiparallel alignment of the magnetizations, respectively. The higher the TMR ratio, the more readily a bit can be reliably stored in association with the pMTJ resistive state. The TMR ratio of a given pMTJ is therefore an important performance metric of a spin transfer torque memory (STTM) that employs an pMTJ stack.

For an STTM device, current-induced magnetization switching may be used to set the bit states. Polarization states of a first (free) ferromagnetic layer can be switched relative to a fixed polarization of the second (fixed) ferromagnetic layer via the spin transfer torque phenomenon, enabling states of the pMTJ to be set by application of current. Angular momentum (spin) of the electrons may be polarized through one or more structures and techniques (e.g., direct current, spin-hall effect, etc.). These spin-polarized electrons can transfer their spin angular momentum to the magnetization of the free layer and cause it to precess. As such, the magnetization of the free magnetic layer can be switched by a pulse of current (e.g., in about 1-10 nanoseconds) exceeding a certain critical value, while magnetization of the fixed magnetic layer remains unchanged as long as the current pulse is below some higher threshold associated with the fixed layer architecture.

MTJs with magnetic electrodes having a perpendicular (out of plane of substrate) magnetic easy axis have a potential for realizing higher density memory than in-plane variants. Generally, perpendicular magnetic anisotropy (PMA) can be achieved in the free magnetic layer through interfacial perpendicular anisotropy established by an adjacent layer, such as magnesium oxide (MgO), when the free magnetic layer is sufficiently thin. Thin layers however are often associated with a relatively low coercive field $H_c$. Techniques and structures that can increase $H_c$ for a given magnetic layer thickness are therefore advantageous, for example to improve pMTJ stability.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
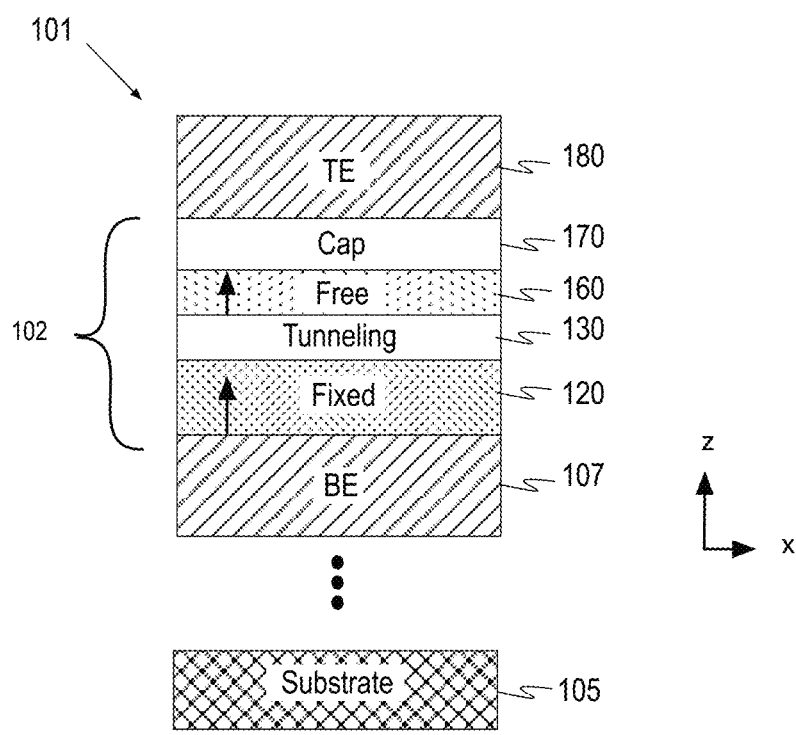
FIG. 1 is a cross-sectional view of a material layer stack for a STTM device, in accordance with some embodiments of the present invention.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are pMTJ material stacks, STTM devices employing such material stacks, and computing platforms employing such STTM devices. In some embodiments, perpendicular pMTJ material stacks include at least a free magnetic layer that is laterally strained in a direction orthogonal to the magnetic easy axis for improved junction stability. In some exemplary embodiments, an entire pMTJ material stack including a tunnel dielectric material layer disposed between a fixed magnetic material layer and a free magnetic material layer (both having perpendicular magnetic anisotropy) is laterally strained, increasing associated coercive field strengths. Applications for embodiments described herein include embedded memory, embedded non-volatile memory (NVM), magnetic random access memory (MRAM), and non-embedded or stand-alone memories.

Thermal stability Δ is one of the most important issues facing scaling of STTM based devices and memory arrays fabricated there from. Greater thermal stability is associated with longer memory element non-volatile lifetimes. As scaling continues, it becomes more difficult to maintain sufficient stability. Thermal stability is defined as the energy barrier E between two magnetic states (e.g., (1, 0), (parallel, anti-parallel)). Stability is equal to the product of magnetic anisotropy $k_{eff}$ of the free magnetic material and volume of free magnetic material (thickness t multiplied by material stack area A) divided by thermal energy ($k_B T$):

$$\Delta = \frac{K_{eff} t A}{k_B T}. \tag{1}$$

Generally, a stability value of at least 60 $k_B T$ is considered a suitable for most applications. However, it is clear that scaling of a memory cell area reduces stability and the 60 $k_B T$ target becomes harder to achieve. Magnetic anisotropy is further a function of saturation magnetization Ms and effective anisotropy field $H_{k,eff}$ such that thermal stability may be improved through an increase in anisotropy field. Perpendicular magnetic anisotropy (PMA) in the free magnetic layer can achieve greater $H_{k,eff}$ in the presence of interfacial perpendicular anisotropy established by an adjacent layer, such as magnesium oxide (MgO), when the free magnetic layer is sufficiently thin.

Damping relates to a magnetic friction that a spin's magnetization experiences as the spin switches from one state to another. Greater damping means that a larger critical write current $J_c$ is needed to switch the magnetization of the free layer from one state to another. Critical current $J_c$ is proportional to a damping constant α multiplied by a ratio of stability over spin transfer efficiency (~TMR).TMR. Damping increases however as free magnetic layer thickness decreases due to spin pumping effect. Often then, increases in anisotropy also increase the critical current density linearly, making it difficult to achieve higher stability without a concomitant increase in damping.

In some embodiments herein, the stability of a STTM cell is enhanced and/or damping reduced by inducing strain in at least the free magnetic layer. This strain, if aligned properly with respect to the magnetic field direction can enhance coercive field strength for a given free magnetic material layer thickness. For a pMTJ stack, the strain should be lateral, substantially parallel with a surface of the substrate, and orthogonal to the magnetic field direction.

FIG. 1 is a cross-sectional view of a pMTJ device 101, in accordance with some embodiments of the present invention. pMTJ device 101 includes a pMTJ material stack 102 disposed between two electrodes 107 and 180. In the exemplary embodiment, metal electrode 107 (e.g., bottom electrode) is disposed over a substrate 105. A fixed magnetic material layer (or stack) 120 including one or more layer of magnetic material is disposed over electrode 107. A tunneling dielectric material layer 130 is disposed over fixed magnetic material layer or stack 120. A free magnetic material layer (or stack) 160 is disposed over tunneling dielectric material layer 130. In the exemplary embodiment illustrated, a dielectric material layer 170, such as a metal oxide (e.g., MgO, VO, WO, VdO, TaO, HfO, MoO), is disposed over free magnetic material layer 160. Such a capping layer may be absent for spin-hall effect (SHE) implementations. Metal electrode 180 (e.g., top electrode) is disposed over the capping dielectric material layer 170. Notably, the order of the material layers 107-180 may be inverted, or extending laterally away from a topographic feature sidewall, in alternative embodiments.

In some embodiments, pMTJ material stack 102 is a perpendicular system, where spins of the magnetic layers are perpendicular to the plane of the material layers (i.e., the magnetic easy axis is in the z-direction out of the plane of substrate 105). Fixed magnetic layer 120 may be composed of any material or stack of materials suitable for maintaining a fixed magnetization direction while the free magnetic material layer 160 is magnetically softer (i.e. magnetization can easily rotate to parallel and antiparallel state with respect to fixed layer). In some embodiments, pMTJ material stack 102 is based on a CoFeB/MgO system, having an MgO tunneling material layer 130, CoFeB fixed magnetic layer/stack 120, and CoFeB free magnetic layer/stack 160. In advantageous embodiments, all CoFeB layers have body-centered cubic (BCC) (001) out-of-plane texture, where texture refers to the distribution of crystallographic orientations within in the layers of pMTJ stack 101. For at least some such embodiments, a high percentage of CoFeB crystals of the CoFeB/MgO/CoFeB stack 101 have the preferred (001) out-of-plane orientation (i.e., the degree of texture is high). In some CoFeB/MgO embodiments, the (001) oriented CoFeB magnetic material layers 120, 160 are iron-rich alloys (i.e., Fe>Co) for increased magnetic perpendicularity. In some embodiments, Fe content is at least 50%. Exemplary embodiments include 20-30% B (e.g., $Co_{20}Fe_{60}B_{20}$). Other embodiments with equal parts cobalt and iron are also possible (e.g., $Co_{40}Fe_{40}B_{20}$). Other magnetic material compositions are also possible for the fixed and/or free magnetic layers, such as but not limited to: Co, Fe, Ni, and non-boron alloys of these metals (e.g., CoFe). Film thickness of free magnetic layer 160 in some advantageous embodiments is between 0.6 and 1.6 nm.

Tunneling dielectric material layer 130 is composed of a material or stack of materials suitable for allowing current of a majority spin to pass through the layer, while impeding current of a minority spin (i.e., a spin filter), impacting the tunneling magnetoresistance associated with pMTJ material stack 102. In some exemplary embodiments, dielectric material layer 130 is magnesium oxide (MgO). Dielectric material layer 130 may further provide a crystallization template (e.g., BCC with (001) texture) for solid phase epitaxy of free magnetic material layer 160 and/or fixed magnetic material layer 120.

Figure 2:
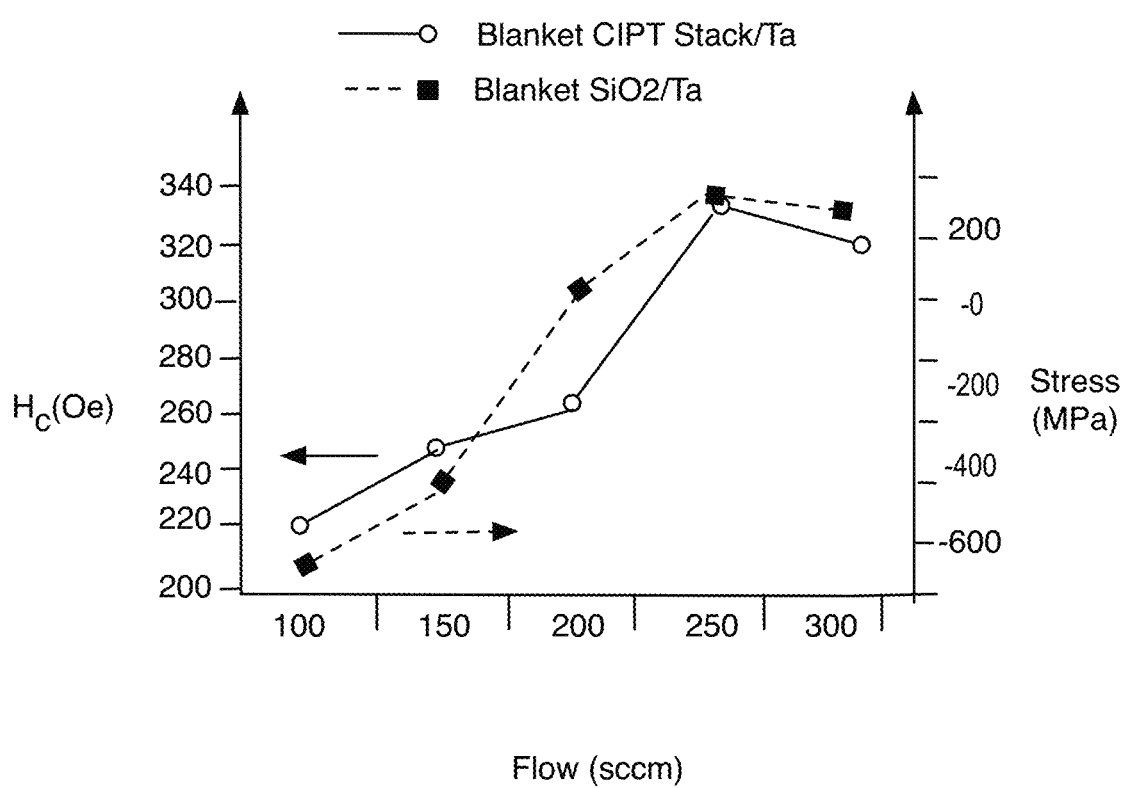
FIG. 2 is a graph of pMTJ coercive field and film stress as a function of gas flow during sputter deposition of a strain-inducing material layer, in accordance with some embodiments.

In some embodiments, a strain-enhanced pMTJ device is provided by application of laterally directed stress sufficient to induce strain in the pMTJ stack parallel to the plane of the pMTJ material layers. The inventors have found control of stress in films applied over or adjacent to a pMTJ material stack can have a significant impact on the coercivity of the magnetic material layers corresponding to strain in one or more of the magnetic material layers. FIG. 2 is a graph of pMTJ coercive field and capping film stress as a function of gas flow employed during sputter deposition of the capping film, in accordance with some embodiments. The coercive field $H_c$ was measured with the current in-plane tunneling method (CIPT) for a full pMTJ material stack blanket-deposited over a substrate. Over the full pMTJ material stack, a top electrode material layer was blanket deposited with a different Ar flow for each treatment. Film stress in the top electrode material layer as a function of Ar partial pressures associated with Ar gas flow during sputter deposition of the top electrode material (e.g., Ta or TiN) is further illustrated. As shown, for the particular top electrode material, film stress was tuned between 600 MPa compressive and 250 MPa tensile. Notably, coercive field strength is strongly correlated with top electrode material film stress, illustrating how control of stress in the top electrode material provides a path to strain-engineer a pMTJ material stack. Further noting that an overlying tensile-stressed material layer exerts a compressive force over the interface area of an underlayer in the plane of the pMTJ material layers, the 250 sccm Ar flow associated with peak tensile stress maximizes a lateral compressive strain in the pMTJ stack, providing a higher coercivity for the a given pMTJ stack.

Figure 3A:
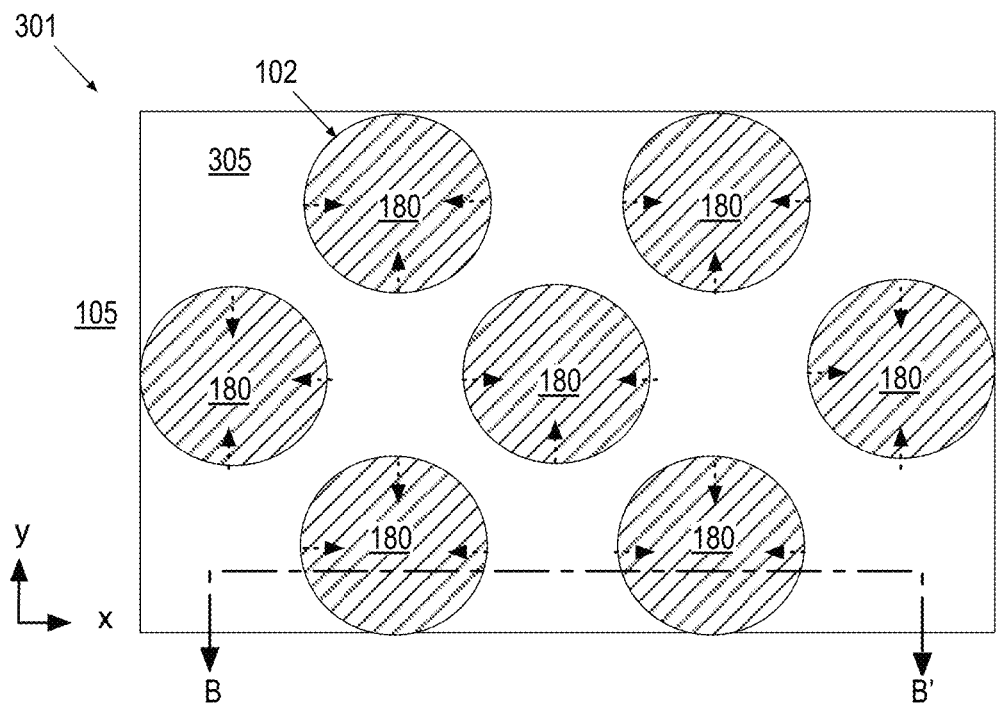
FIG. 3A is a plan view of a pMTJ device including a plurality of laterally-strained pMTJ devices, in accordance with embodiments.
Figure 3B:
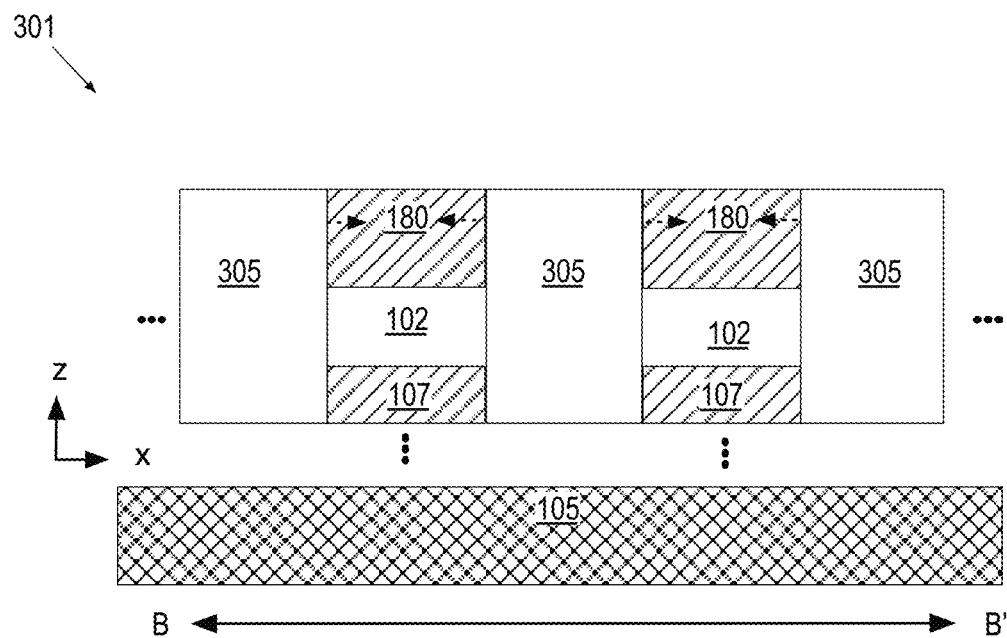
FIG. 3B is a cross-sectional view of pMTJ devices illustrated in FIG. 3A, in accordance with embodiments.

In some embodiments, a lateral strain-inducing material layer is disposed over a top surface or a sidewall of a pMTJ material stack. FIG. 3A is a plan view of a strained pMTJ device 301 including a plurality of pMTJ material stacks 102, in accordance with embodiments. FIG. 3B is a cross-sectional view of the strained pMTJ device 301 along the B-B' line illustrated in FIG. 3A, in accordance with embodiments. The plurality of pMTJ material stacks 102 is arrayed over an area of substrate 105 with each pMTJ stack 102 separated by an interlayer dielectric 305. In some exemplary embodiments, the pMTJ device 301 includes a top-side lateral strain inducing material layer or cap. In the exemplary embodiment illustrated, a top-side lateral strain-inducing material layer 180 is disposed over the pMTJ material stacks 102. As illustrated by arrows in FIGS. 3A and 3B, top-side lateral strain-inducing material layer 180 applies a compressive force parallel to the top surface of each pMTJ stack 102. Accordingly, at least the magnetic material layers) and advantageously all material layers in pMTJ stacks 102 are compressively strained in lateral directions (e.g., x,y) perpendicular to the magnetic field direction.

In some embodiments, top-side lateral strain-inducing material layer 180 further functions as the top electrode in a pMTJ device. In some embodiments, top-side lateral strain-inducing material layer 180 is Ta, either in pure elemental form or an alloy thereof (e.g., TaN, etc.). In other embodiments, top-side lateral strain-inducing material layer 180 is Ti, either in pure elemental form or an alloy thereof (e.g., TiN, etc.). Any other conductive material that may be tuned to have high tensile stress (e.g., 200 MPa, or more) may also be employed. A top-side lateral strain-inducing material may also be a dielectric (e.g., SiN) capping a pMTJ device electrode. For such embodiments, a conductive via may pass through the lateral strain-inducing material to contact the underlying electrode. In some embodiments, to increase an amount of lateral strain within pMTJ stacks 102, top-side lateral strain-inducing material layer 180 has a thickness (e.g., z-dimension in FIG. 3B) greater than that of any material layer (e.g., magnetic or dielectric) in the pMTJ stack. In some further embodiments, top-side lateral strain-inducing material layer 180 has a thickness greater than that of the entire underlying pMTJ stack 102.

In some embodiments, a lateral strain-inducing material layer is disposed over a sidewall of a pMTJ material stack. The lateral strain-inducing material layer may be in direct contact with pMTJ material stack sidewalls, or separated from the stack by an intervening stack encapsulant. The lateral strain-inducing material may be deposited between adjacent pMTJ material stacks with a deposition process tuned to form a material having high compressive stress. A compressive-stressed material layer adjacent to sidewalls of the pMTJ will exert a force against the pMTJ stack sidewalls parallel to the plane of the pMTJ material layers and perpendicular to the pMTJ stack sidewalls. Force exert by compressive-stressed material layer out of the plane of the pMTJ material layers may be relatively small, limited by the z-thickness of the pMTJ material layers. In some further embodiments, a lateral strain-inducing material layer is disposed over both a top surface of a pMTJ material stack and a sidewall of a pMTJ material stack. For example, a lateral strain-inducing material layer may include both a tensile-stressed material deposited as the top electrode in a pMTJ device, and a compressive-stressed material layer deposited between adjacent pMTJ material stacks, both of which induce lateral compressive strain within the pMTJ material stack.

Figure 4A:
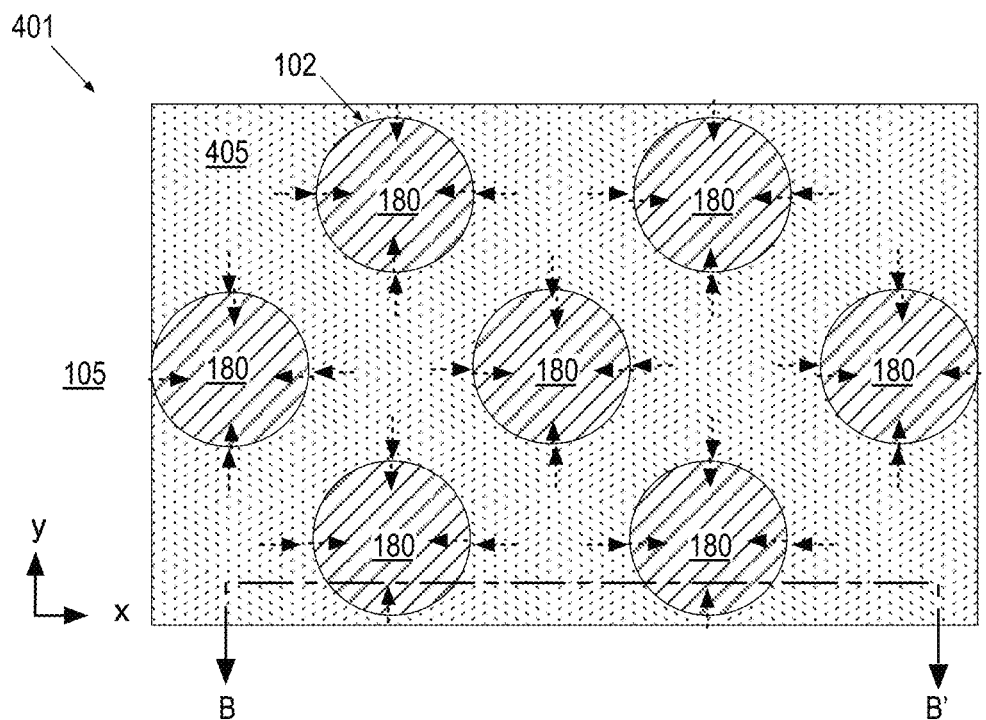
FIG. 4A is a plan view of a pMTJ device including a plurality of laterally-strained pMTJ devices, in accordance with embodiments.
Figure 4B:
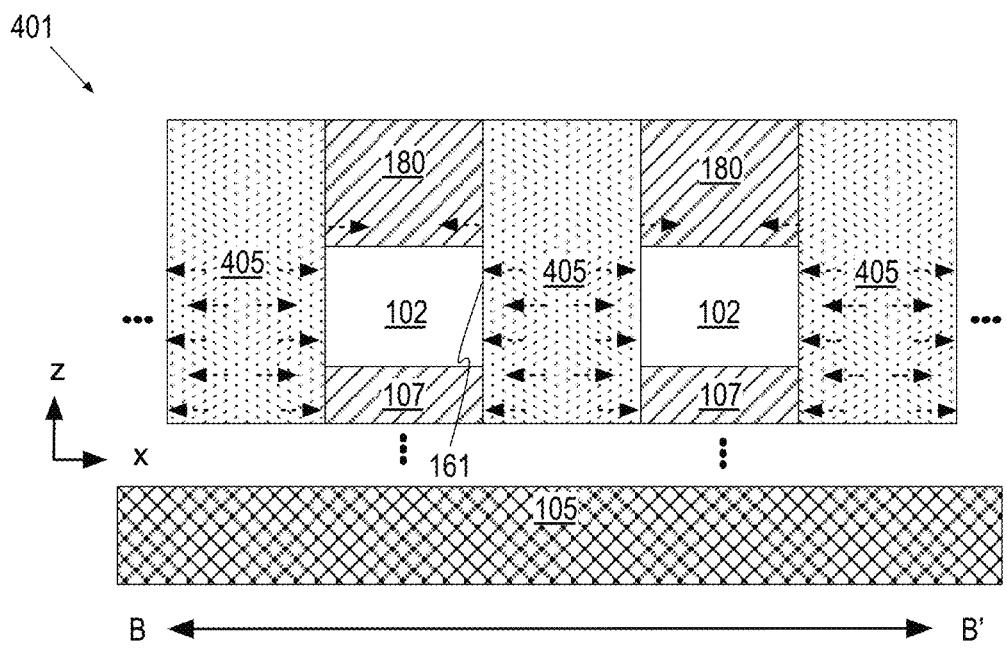
FIG. 4B is a cross-sectional view of pMTJ devices illustrated in FIG. 4A, in accordance with embodiments.

FIG. 4A is a plan view of a strained pMTJ device 401 including a plurality of pMTJ material stacks 102, in accordance with some embodiments. FIG. 4B is a cross-sectional view of a the strained pMTJ device 401 along the B-B' line illustrated in FIG. 4A, in accordance with embodiments. As illustrated, the pMTJ device 401 includes an adjacent lateral strain-inducing material layer 405 surrounding the array of pMTJ structures, and top-side lateral strain-inducing material layer 180 disposed over the pMTJ material stacks 102. As illustrated by arrows in FIGS. 4A and 4B, adjacent lateral strain-inducing material layer 405 applies a compressive force perpendicular to sidewalls of adjacent pMTJ stacks 102, augmenting the compressive force applied by top-side lateral strain-inducing material layer 180 in a direction parallel to a top surface of pMTJ stacks 102. Adjacent lateral strain-inducing material layer 405 may be employed in combination with, or without, top-side lateral strain-inducing material layer 180.

Adjacent lateral strain-inducing material layer 405 may be any material that can be tuned to have high compressive stress (e.g., 200 MPa, or more, and advantageously at least 400 MPa). In some embodiments, adjacent lateral strain-inducing material layer 405 is a dielectric material, such as, but not limited to $Al_2O_3$, SiO, SiON, and SiN. Dielectric materials may further function as interlayer dielectric, electrically insulating pMTJ material layers from other layers in the same stack or adjacent pMTJ stacks. Adjacent lateral strain-inducing material layer 405 at least covers the free magnetic material layer(s) and advantageously also covers the fixed magnetic material layer(s). In some advantageous embodiments, lateral strain-inducing material layer 405 covers the entire pMTJ sidewall 161 to apply force against the entire z-height of the pMTJ material stack. In the exemplary embodiment illustrated in FIG. 4A-4B, lateral strain-inducing material layer 405 is in direct contact with material layers in the pMTJ stacks.

In some advantageous embodiments, adjacent lateral strain-inducing material layer 405 backfills gaps between adjacent pMTJ structures in strained pMTJ device 401. For example, a top surface of adjacent lateral strain-inducing material layer 405 is planar with a top surface of top-side lateral strain-inducing material layer 180. If top-side lateral strain-inducing material layer 180 is absent, adjacent lateral strain-inducing material layer 405 may have a top surface planar with a top surface of pMTJ material stack 102.

Figure 5A:
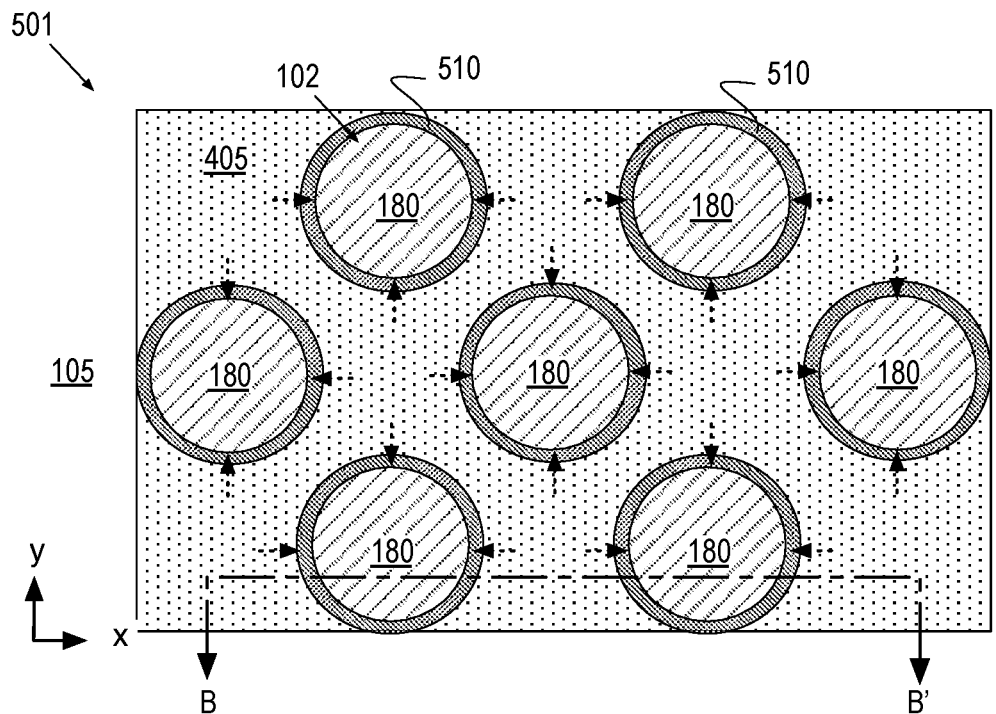
FIG. 5A is a plan view of a pMTJ device including a plurality of laterally-strained pMTJ devices, in accordance with embodiments.
Figure 5B:
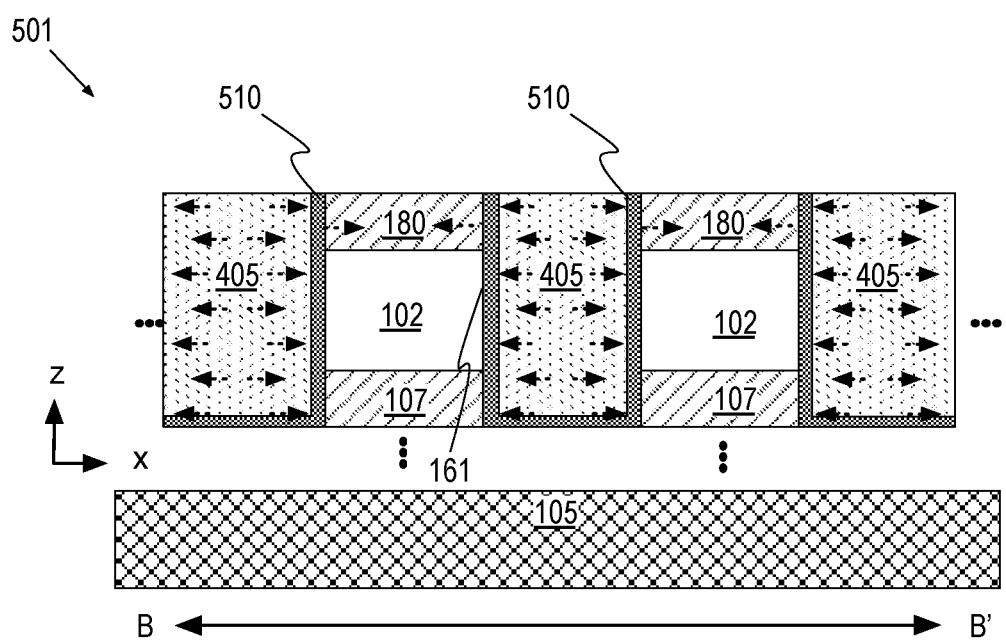
FIG. 5B is a cross-sectional view of pMTJ devices illustrated in FIG. 5A, in accordance with embodiments.

In some embodiments, an adjacent lateral strain-inducing material layer is separated from a pMTJ material stack by an intervening stack encapsulation. For such embodiments, a dielectric material (e.g., any of those described for pMTJ device 401), or a conductive material layer may be employed to laterally strain a pMTJ material stack. FIG. 5A is a plan view of a strained pMTJ device 501 including a plurality of strained pMTJ material stacks 102, in accordance with some embodiments. FIG. 5B is a cross-sectional view of the strained pMTJ device 501 along the B-B' line illustrated in FIG. 5A, in accordance with embodiments.

In some embodiments, adjacent lateral strain-inducing material layer 405 is a conductive material. Many conductive materials can be deposited with higher compressive stress than most dielectric materials, so greater strain may be induced in the pMTJ stack. Adjacent lateral strain-inducing material layer 405 may be a metal, for example. In some exemplary embodiments, the metal comprises at least one of Ta, W, or Ru. In some embodiments, adjacent lateral strain-inducing material layer 405 includes Ta, either in pure elemental form or an alloy thereof (e.g., TaN, etc.). Ta films can be advantageously sputter deposited to very high levels of compressive stress (e.g., 200-400 MPa, or more). In other embodiments, adjacent lateral strain-inducing material layer 405 includes W or Ru, either in pure elemental form or an alloy thereof.

Figure 6:
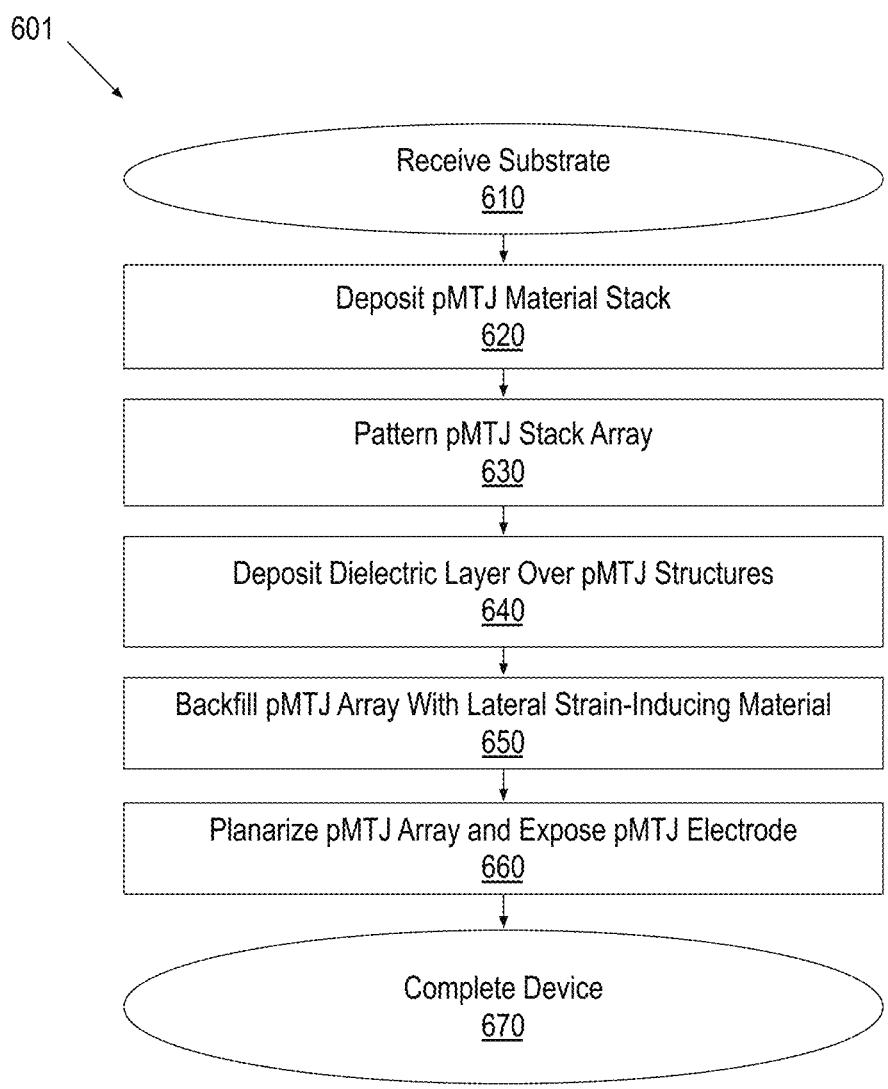
FIG. 6 is a flow diagram illustrating a method of fabricating the pMTJ device illustrated in FIG. 5A-5B, in accordance with some embodiments.

As further illustrated in FIGS. 5A and 5B, adjacent lateral strain-inducing material layer 405 is separated from material layer of pMTJ stack 102 by an intervening dielectric material layer 510. Dielectric material layer 510 is disposed over pMTJ stack 102, covering a perimeter sidewall of one or more (e.g., all) material layers of pMTJ stack 102. As further illustrated, dielectric material layer 510 also separates electrode materials 107 and 180 from adjacent lateral strain-inducing material layer 405, preventing conductive adjacent lateral strain-inducing material layers from electrically shorting pMTJ devices. Dielectric material layer 510 may have any composition of sufficiently high electrical resistivity, such as, but not limited to SiO, SiON, SiN, any known low-k dielectric, and the like. Dielectric material layer 510 may have a wide range of thickness (e.g., 2-20 nm) and is advantageously less than 5 nm to maximize the volume of conductive lateral strain-inducing material layer 405. In the example further illustrated in FIG. 4B, metal strain-inducing material 405 backfills gaps between adjacent pMTJ stacks to be planar with a top surface of top electrode 180, with dielectric material layer 510 disposed there between.

pMTJ material stacks and devices in accordance with the architectures above may be fabricated by a variety of methods applying a variety of techniques and processing chamber configurations. FIG. 6 is a flow diagram illustrating a method 601 for fabricating the pMTJ device 501 illustrated in FIG. 5, in accordance with some embodiments. Method 601 begins with receiving a substrate at operation 610. Any substrate known to be suitable for microelectronic fabrication may be received, such as, but not limited to crystalline silicon substrates. Transistors and/or one or more levels of interconnect metallization may be present on the substrate as received at operation 610.

At operation 620, the pMTJ material stack is deposited. In exemplary embodiments, a bottom electrode metal, fixed magnetic layer or material stack, such as Fe-rich CoFeB, are deposited. Various underlayers, such as a SAF structure may also be deposited. A tunneling dielectric material, such as MgO, is deposited over the fixed magnetic layer. A free magnetic material layer, such as Fe-rich CoFeB, is deposited over the tunneling dielectric material. A dielectric cap material, such as MgO, may be further deposited over the free magnetic layer. A top electrode metal is then deposited over the pMTJ material stack. In exemplary embodiments, operation 620 entails a physical vapor deposition (sputter deposition) performed at a temperature below 250° C. One or more of co-sputter and reactive sputtering may be utilized in any capacity known in the art to form the various layer compositions described herein. For PVD embodiments, one or more of the material layers, such as but not limited to the magnetic fixed and free material layers, are deposited in amorphous form that may be discontinuous over a substrate area (e.g., forming islands that do not coalesce). Alternate deposition techniques, such as atomic layer deposition (ALD) may be performed for those materials having known precursors. Alternatively, epitaxial processes such as, but not limited to, molecular beam epitaxy (MBE) may be practiced to grow one or more of the pMTJ material layers. For one or more of these alternative deposition techniques, at least the magnetic material layers may be deposited with at least some microstructure (e.g., polycrystalline with texture).

In some embodiments, deposition of a top electrode metal further comprises depositing a metal with high tensile stress by physical vapor deposition (PVD). For example at least one of Ta or Ti is deposited over the pMTJ material stack at operation 620. In some exemplary Ta embodiments, the deposition is performed with a high Ar partial pressure to deposit a Ta film having a tensile stress of at least 200 MPa.

Method 601 continues with patterning the pMTJ material stack in to an array of pMTJ device structures at operation 630. Any known patterning process may be employed at operation 630 to delineate an array of pMTJ device structures. At operation 640 a dielectric material layer is deposited over the array of pMTJ device structures. Any known low temperature deposition technique may be employed, such as, but not limited to plasma enhanced chemical vapor deposition (PECVD), PVD, or the like. In some embodiments, the dielectric material layer is deposited directly on a sidewall of the pMTJ material layers (e.g., free magnetic layer and fixed magnetic layer).

At operation 650, the dielectric encapsulated pMTJ device array is backfilled with a lateral strain-inducing material. In some exemplary embodiments, a metal material layer with high compressive stress is deposited over the dielectric material layer. In some embodiments, operation 650 entails sputter depositing Ta, W, or Ru, in either pure or alloy form. Sputter process parameters, such as Ar partial pressure may be set to deposit a metal film with a compressive stress of 400 MPa, or more. The sputter deposition may be performed for a duration sufficient to completely backfill gaps between two adjacent pMTJ material stacks.

A operation 660, the pMTJ array is planarized, exposing a top electrode of the pMTJ devices, which may then be interconnected into an addressable memory cell array in completion of the device at operation 670. Any standard microelectronic fabrication processes such as lithography, etch, thin film deposition, planarization (e.g., CMP), and the like may be performed to complete interconnection of an STTM device employing any of the strained pMTJ material devices described herein or a subset of the material layers therein.

After one or more layers of the pMTJ material stack (e.g., all layers) are deposited, an anneal is performed under any conditions known in the art to promote solid phase epitaxy of the free magnetic layers and/or fixed magnetic layer imparting polycrystalline BCC microstructure and (001) texture. Anneal temperatures, durations, and environments may vary with exemplary embodiments performing an anneal at 250° C., or more. In some embodiments, the thermal anneal is performed after lateral strain-inducing material is deposited over the pMTJ material stacks. In other embodiments, the thermal anneal is performed before lateral strain-inducing material is deposited over the pMTJ material stacks.

In an embodiment, the pMTJ functions essentially as a resistor, where the resistance of an electrical path through the pMTJ may exist in two resistive states, either "high" or "low," depending on the direction or orientation of magnetization in the free magnetic layer(s) and in the fixed magnetic layer(s). In the case that the spin direction is down (minority) in the free magnetic layer(s), a high resistive state exists and the directions of magnetization in the coupled free magnetic layer(s) and the fixed magnetic layer(s) are anti-parallel with one another. For the case that the spin direction is up (majority) in the coupled free magnetic layers, a low resistive state exists, and the directions of magnetization in the coupled free magnetic layers and the fixed magnetic layer are parallel with one another. The terms "low" and "high" with regard to the resistive state of the pMTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the coupled free magnetic layers may be switched through a process called spin transfer torque ("STT") using a spin-polarized current. An electrical current is generally non-polarized (e.g. consisting of about 50% spin-up and about 50% spin-down electrons). A spin-polarized current is one with a greater number of electrons of either spin-up or spin-down. The spin-polarized current may be generated by passing a current through the fixed magnetic layer. The electrons of the spin polarized current from the fixed magnetic layer tunnel through the tunneling barrier or dielectric layer 208 and transfers its spin angular momentum to the free magnetic layer, wherein the free magnetic layer will orient its magnetic direction from anti-parallel to that of the fixed magnetic layer or parallel. The spin-hall effect may also be employed to generate spin-polarized current through a particular electrode material that is in contact with a free magnetic material layer. For such embodiments, the free magnetic layer may be oriented without applying current through the fixed magnetic layer and other material layers of the pMTJ. In either implementation, the free magnetic layer may be returned to its original orientation by reversing the current. Thus, the pMTJ may store a single bit of information ("0" or "1") by its state of magnetization. The information stored in the pMTJ is sensed by driving a current through the pMTJ. The free magnetic layer(s) does not require power to retain its magnetic orientations. As such, the state of the pMTJ is preserved when power to the device is removed. Therefore, a spin transfer torque memory bit cell composed of the material stacks described herein is non-volatile.

Figure 7:
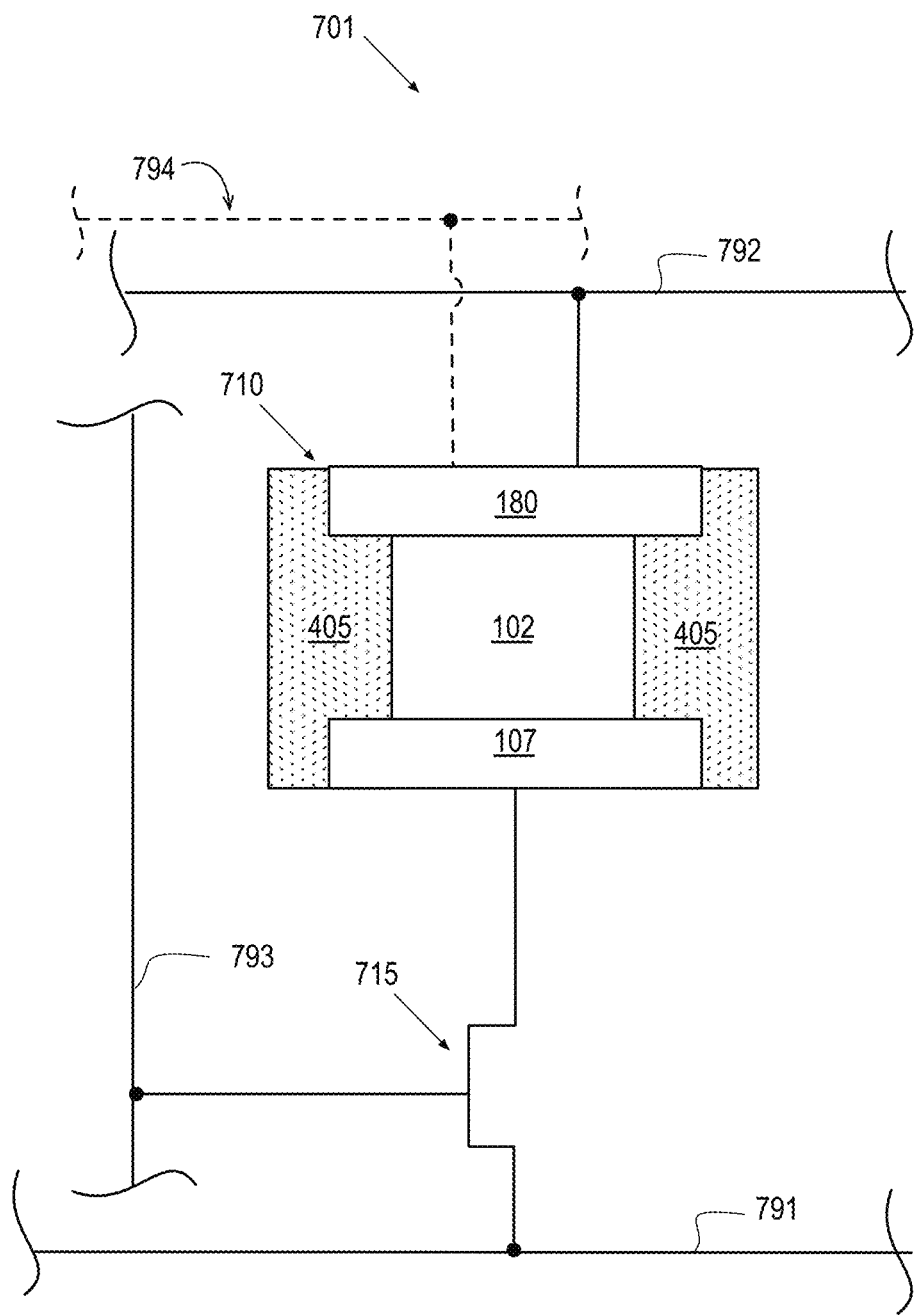
FIG. 7 is a schematic of a STTM bit cell, which includes a spin transfer torque element employing a laterally strained pMTJ device, in accordance with an embodiment of the present invention.

FIG. 7 is a schematic of a STTM bit cell 701, which includes a spin transfer torque element 710, in accordance with an embodiment of the present invention. The spin transfer torque element 710 includes a pMTJ device laterally strained, for example by adjacent material layer 405. Element 710 further includes first metallization 107 and a second metallization 180, at least one of which is in tension (tensile-stressed). Second metallization 180 is electrically coupled to a first metal interconnect 792 (e.g., bit line). First metallization 107 is electrically connected to a second metal interconnect 791 (e.g., source line) through a transistor 715. The transistor 715 is further connected to a third metal interconnect 793 (e.g., word line) in any manner conventional in the art. In SHE implementations second metallization 180 may be further coupled to a fourth metal interconnect 794 (e.g., maintained at a reference potential relative to first metal interconnect 792). The spin transfer torque memory bit cell 701 may further include additional read and write circuitry (not shown), a sense amplifier (not shown), a bit line reference (not shown), and the like, as understood by those skilled in the art of solid state non-volatile memory devices. A plurality of the spin transfer torque memory bit cell 710 may be operably connected to one another to form a memory array (not shown), wherein the memory array can be incorporated into a non-volatile memory device.

Figure 8:
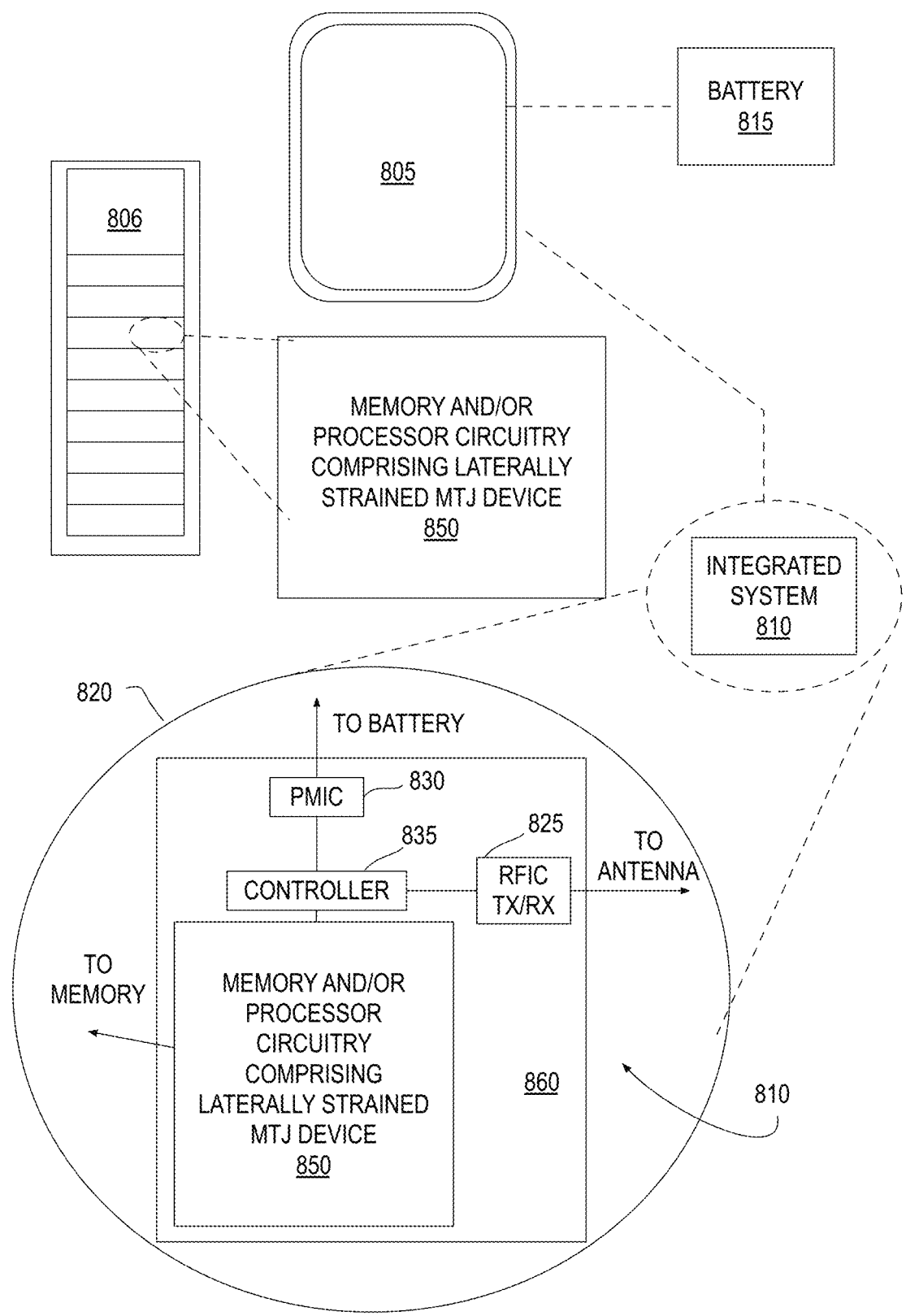
FIG. 8 is a schematic illustrating a mobile computing platform and a data server machine employing STTM arrays, in accordance with embodiments of the present invention.

FIG. 8 illustrates a system 800 in which a mobile computing platform 805 and/or a data server machine 806 employs laterally strained pMTJ devices, for example in accordance with embodiments of the present invention described above. The server machine 806 may be any commercial server, for example including any number of high-performance computing platforms disposed within a rack and networked together for electronic data processing, which in the exemplary embodiment includes a packaged device 850.

The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level or package-level integrated system 810, and a battery 815.

Whether disposed within the integrated system 810 illustrated in the expanded view 820, or as a stand-alone packaged device within the server machine 806, SOC 860 includes laterally strained pMTJ devices. SOC 560 may further include a memory circuitry and/or a processor circuitry 840 (e.g., STTM, MRAM, a microprocessor, a multi-core microprocessor, graphics processor, etc.). Any of controller 835, PMIC 830, or RF (radio frequency) integrated circuitry (RFIC) 825 may include embedded STTM employing laterally strained pMTJ devices.

As further illustrated, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these SoC modules may be integrated onto separate ICs coupled to a package substrate, interposer, or board.

Figure 9:
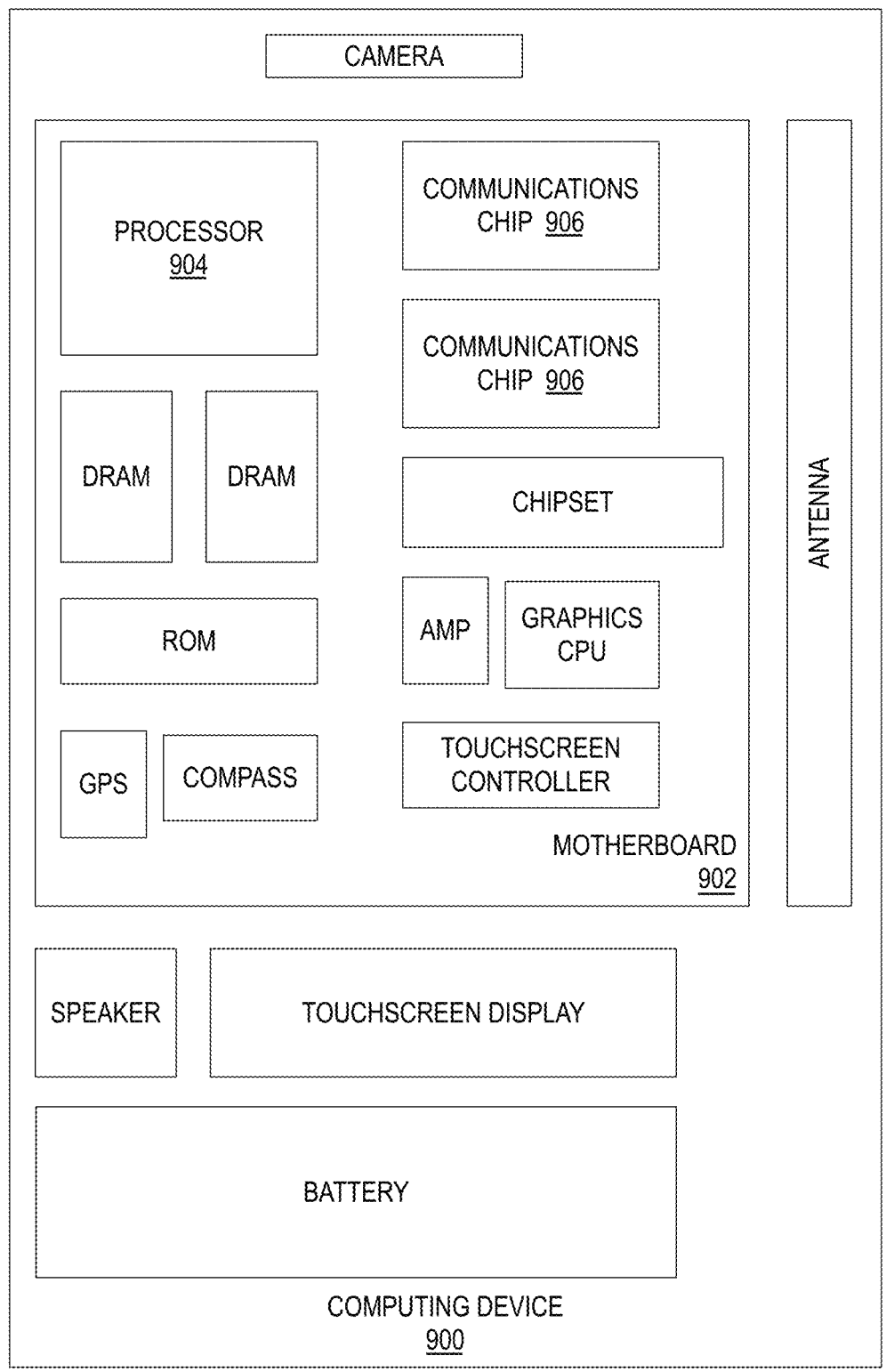
FIG. 9 is a functional block diagram illustrating an electronic computing device, in accordance with an embodiment of the present invention.

FIG. 9 is a functional block diagram of a computing device 900, arranged in accordance with at least some implementations of the present disclosure. Computing device 900 may be found inside platform 905 or server machine 906, for example. Device 900 further includes a motherboard 902 hosting a number of components, such as, but not limited to, a processor 904 (e.g., an applications processor), which may further incorporate embedded magnetic memory based on pMTJ material stacks including a Mo-based free magnetic coupling layer, in accordance with embodiments of the present invention. Processor 904 may be physically and/or electrically coupled to motherboard 902. In some examples, processor 904 includes an integrated circuit die packaged within the processor 904. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 902. In further implementations, communication chips 906 may be part of processor 904. Depending on its applications, computing device 900 may include other components that may or may not be physically and electrically coupled to motherboard 902. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including but not limited to those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, a perpendicular magnetic tunneling junction (pMTJ) device comprises a pMTJ material stack disposed over a substrate, the material stack including a tunnel dielectric material layer disposed between a fixed magnetic material layer and a free magnetic material layer, both having perpendicular magnetic anisotropy. The device includes a dielectric material layer disposed over the pMTJ stack, the dielectric material layer covering a perimeter sidewall of at least the free magnetic material layer, and a metal disposed over the dielectric, at least partially surrounding the perimeter sidewall.

In furtherance of the first embodiments, the metal is an elemental refractory metal or alloy thereof.

In furtherance of the first embodiments immediately above, the metal comprises at least one of Ta, W, or Ru.

In furtherance of the first embodiments, the pMTJ material stack is one stack of an array of pMTJ material stacks, and the metal backfills gaps between adjacent pMTJ material stacks within the array, completely surrounding each pMTJ material stack.

In furtherance of the first embodiments immediately above, the metal is planar with a top surface of an electrode of the pMTJ material stack, and the dielectric material layer is disposed between a sidewall of the electrode and the metal strain-inducing material.

In one or more second embodiments, a perpendicular magnetic tunneling junction (pMTJ) device disposed over a substrate comprises a pMTJ material stack disposed over a substrate, the material stack including a tunnel dielectric material layer disposed between a fixed magnetic material layer and a free magnetic material layer, both having perpendicular magnetic anisotropy. The material stack includes a lateral strain-inducing material layer disposed over at least one of a top surface or sidewall of the pMTJ material stack.

In furtherance of the second embodiments, the lateral strain-inducing material comprises a tensile-stressed top electrode material disposed over the pMTJ material stack.

In furtherance of the second embodiments immediately above, the top electrode material comprises Ta.

In furtherance of the second embodiments above, the lateral strain-inducing material further comprises a compressive-stressed dielectric or metal disposed adjacent to a sidewall of the free magnetic layer, fixed magnetic layer and tunnel dielectric layer.

In furtherance of the second embodiments immediately above, the lateral strain-inducing material adjacent to the sidewall is planar with a top surface of the top electrode material, with a dielectric material layer disposed between a sidewall of the top electrode and the strain-inducing material.

In one or more third embodiments, a non-volatile memory cell comprises a first electrode, a second electrode coupled to a bit line of a memory array, the pMTJ device of any of the first or second embodiments, and a transistor with a first terminal electrically coupled to the first electrode, a second terminal electrically coupled to a source line of the memory array, and a third terminal electrically coupled to a word line of the memory array.

In one or more fourth embodiments, a non-volatile memory cell comprises a first electrode, a second electrode coupled to a bit line of a memory array, a pMTJ material stack disposed between the first and second electrodes and including a tunnel dielectric material layer disposed between a fixed magnetic material layer and a free magnetic material layer, both having perpendicular magnetic anisotropy. The cell includes a lateral strain-inducing material disposed over a top surface or a sidewall of the pMTJ material stack, and a transistor with a first terminal electrically coupled to the first electrode, a second terminal electrically coupled to a source line of the memory array, and a third terminal electrically coupled to a word line of the memory array.

In one or more fifth embodiments, a non-volatile memory device includes a plurality of the non-volatile memory cell according to the fourth third embodiments. The free and fixed magnetic material layers comprise CoFeB. The lateral strain-inducing material comprises a metal disposed over a sidewall of the free magnetic layer, fixed magnetic layer and tunnel dielectric layer and separated from the CoFeB by an intervening dielectric material. The memory device comprises an array of pMTJ material stacks, and the metal lateral strain-inducing material backfills gaps between adjacent pMTJ material stacks within the array, completely surrounding each pMTJ material stack of the array.

In one or more sixth embodiments, a mobile computing platform comprises a non-volatile memory comprising a plurality of the non-volatile memory cell of any one of the fourth embodiments, a processor communicatively coupled to the non-volatile memory, a battery coupled to the processor; and a wireless transceiver.

In one or more seventh embodiments, a method of forming a perpendicular magnetic tunneling junction (pMTJ) device comprises depositing a pMTJ material stack over a substrate, the pMTJ material stack including a tunnel dielectric material layer disposed between a fixed magnetic material layer and a free magnetic material layer, both having perpendicular magnetic anisotropy. The method comprises patterning the pMTJ material stack into an array of discrete pMTJ structures disposed over the substrate, and depositing a compressive-stressed material over the array, the compressive-stressed material covering a sidewall of at least the free magnetic layer, planarizing the compressive-stressed material with the array of pMTJ structures to expose a plurality of pMTJ electrodes, and interconnecting the pMTJ electrodes.

In furtherance of the seventh embodiments, depositing the pMTJ material stack further comprises depositing an electrode metal under tensile stress over the pMTJ material stack.

In furtherance of the seventh embodiments immediately above, depositing the compressive-stressed material over the array further comprises depositing a dielectric material layer directly on the sidewall of the free magnetic layer and the fixed magnetic layer, depositing a compressive-stressed metal material layer over the dielectric material layer, and planarizing the compressive-stressed material further comprises planarizing the metal material layer with a top surface of the pMTJ electrodes.

In furtherance of the seventh embodiments immediately above, depositing the metal further comprises sputter depositing at least one of Ta, W, or Ru, or an alloy thereof.

In furtherance of the seventh embodiments immediately above, depositing the metal further comprises sputter depositing Ta, or an alloy thereof.

In furtherance of the seventh embodiments immediately above, the sputter depositing backfills a gap between two adjacent pMTJ material stacks.

In furtherance of the seventh embodiments, the method further comprises sputter depositing a tensile-stressed electrode material over the pMTJ material stack and patterning the electrode material concurrently with patterning the pMTJ material stack.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A perpendicular magnetic tunneling junction (pMTJ) device, comprising:
   a pMTJ material stack over a substrate, the material stack including a tunnel dielectric material layer between a fixed magnetic material layer and a free magnetic material layer, both having perpendicular magnetic anisotropy; and a compressive-stressed dielectric or metal adjacent to a sidewall of at least the free magnetic layer, wherein:
the pMTJ material stack is one stack of an array of pMTJ material stacks; and
the compressive-stressed dielectric or metal backfills gaps between adjacent pMTJ material stacks within the array, completely surrounding each pMTJ material stack.

2. The pMTJ device of claim 1, wherein the compressive-stressed dielectric or metal is a metal, wherein a dielectric material layer surrounds each pMTJ material stack and the dielectric material layer is between the compressive-stressed metal and the sidewall of the free magnetic material layer, and wherein the metal backfills a gap between the dielectric material layer surrounding a first of the pMTJ material stacks and the dielectric material layer surrounding a second of the pMTJ stacks.

3. The pMTJ device of claim 2, wherein the metal comprises at least one of Ta, W, or Ru.

4. The pMTJ device of claim 2, wherein the metal is planar with a top surface of an electrode of the pMTJ material stack, and the dielectric material layer is between a sidewall of the electrode and the metal.

5. A perpendicular magnetic tunneling junction (pMTJ) device over a substrate, the device comprising:
a pMTJ material stack over a substrate, the material stack including a tunnel dielectric material layer between a fixed magnetic material layer and a free magnetic material layer, both fixed and free magnetic material layers having perpendicular magnetic anisotropy; and
a tensile-stressed top electrode material over the pMTJ material stack, wherein the tensile-stressed top electrode material comprises Ta.

6. The pMTJ device of claim 5, further comprising a compressive-stressed dielectric or metal adjacent to a sidewall of the free magnetic layer, fixed magnetic layer and tunnel dielectric layer.

7. The pMTJ device of claim 6, wherein:
the compressive-stressed dielectric or metal is a metal, the metal is adjacent to the sidewall, and
the metal is planar with a top surface of the top electrode material; and
a dielectric material is between a sidewall of the top electrode and the metal.

8. A non-volatile memory device, comprising:
an array of non-volatile memory cells, each cell comprising:
a first electrode;
a second electrode coupled to a bit line of a memory array;
a perpendicular magnetic tunneling junction (pMTJ) material stack between the first and second electrodes, the pMTJ material stack including a tunnel dielectric material layer between a fixed magnetic material layer and a free magnetic material layer, both the fixed and free magnetic material layers comprising CoFeB and having perpendicular magnetic anisotropy;
and a transistor with a first terminal electrically coupled to the first electrode, a second terminal electrically coupled to a source line of the memory array, and a third terminal electrically coupled to a word line of the memory array; and a compressively stressed dielectric material in contact with a sidewall of the free magnetic layer, fixed magnetic layer and tunnel dielectric layer, wherein the dielectric material backfills gaps between adjacent pMTJ material stacks within the array, completely surrounding each pMTJ material stack of the array.

9. A mobile computing platform comprising:
the non-volatile memory device of claim 8;
a processor communicatively coupled to the non-volatile memory device;
a battery coupled to the processor; and
a wireless transceiver.

10. The pMTJ device of claim 1, wherein the compressive-stressed dielectric or metal has a compressive stress substantially parallel to a plane of the layers of the pMTJ material stack and applies a compressive force perpendicular to the sidewall of at least the free magnetic layer in the adjacent pMTJ stacks, the compressive force sufficient to laterally strain the free magnetic layer in a direction orthogonal to a magnetic easy axis.

11. The pMTJ device of claim 1, wherein the compressive-stressed dielectric or metal has a compressive stress of at least 400 MPa.

12. The memory device of claim 8, wherein the dielectric has a compressive stress substantially parallel to a plane of the layers of the pMTJ material stack and where the dielectric applies a compressive force perpendicular to the sidewall of at least the free magnetic layer in the adjacent pMTJ stacks, the compressive force sufficient to laterally strain the free magnetic layer in a direction orthogonal to a magnetic easy axis.

13. The memory device of claim 8, wherein the metal has a compressive stress of at least 400 MPa.

14. The pMTJ device of claim 5, wherein the tensile-stressed top electrode material has a tensile stress substantially parallel to a plane of the layers of the pMTJ material stack.

15. The pMTJ device of claim 5, wherein the tensile-stressed top electrode material has a tensile stress of at least 200 MPa, and wherein the tensile-stressed top electrode material applies a compressive force sufficient to laterally strain the free magnetic material in a direction orthogonal to a magnetic easy axis.

16. The pMTJ device of claim 1, wherein the compressive-stressed dielectric or metal is a dielectric, and the dielectric is in direct contact with the sidewall of the free magnetic layer, fixed magnetic layer and tunnel dielectric layer.

17. The pMTJ device of claim 16, wherein the dielectric comprises at least one of a compound comprising Al and O, a compound comprising Si and O, or a compound comprising Si and N.

18. The pMTJ device of claim 6, wherein the compressive-stressed dielectric or metal is a dielectric, and the dielectric is in direct contact with the sidewall of the free magnetic layer, fixed magnetic layer and tunnel dielectric layer.

19. The pMTJ device of claim 18, wherein the dielectric comprises at least one of a compound comprising Al and O, a compound comprising Si and O, or a compound comprising Si and N.

20. The pMTJ device of claim 8, wherein the dielectric comprises at least one of a compound comprising Al and O, a compound comprising Si and O, or a compound comprising Si and N.

* * * * *